(12) United States Patent
Kwag

(10) Patent No.: US 11,050,960 B2
(45) Date of Patent: Jun. 29, 2021

(54) IMAGE SENSOR

(71) Applicant: SK hynix Inc., Icheon-si (KR)

(72) Inventor: Pyong Su Kwag, Eumseong-gun (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/838,854

(22) Filed: Apr. 2, 2020

(65) Prior Publication Data

US 2021/0044771 A1    Feb. 11, 2021

(30) Foreign Application Priority Data

Aug. 8, 2019    (KR) .................. 10-2019-0096752

(51) Int. Cl.
*H01L 27/146*    (2006.01)
*H04N 5/374*    (2011.01)
*G01J 1/44*    (2006.01)
*H04N 5/3745*    (2011.01)

(52) U.S. Cl.
CPC .............. *H04N 5/374* (2013.01); *G01J 1/44* (2013.01); *H01L 27/14607* (2013.01); *H01L 27/14641* (2013.01); *H04N 5/3745* (2013.01); *G01J 2001/446* (2013.01)

(58) Field of Classification Search
CPC ......... H01L 27/14607; H01L 27/14612; H01L 27/14641; H04N 5/3745; H04N 5/37457
See application file for complete search history.

(56) References Cited

U.S. PATENT DOCUMENTS

2019/0237496 A1*    8/2019    Kwag ............... H01L 27/14614

FOREIGN PATENT DOCUMENTS

KR    10-2011-0023763 A    3/2011
KR    10-2018-0077710 A    7/2018

* cited by examiner

*Primary Examiner* — Kevin K Pyo
(74) *Attorney, Agent, or Firm* — Perkins Coie LLP

(57) ABSTRACT

An image sensor includes a first unit pixel group including a plurality of photoelectric conversion elements forming a first shared pixel and configured to generate photocharges in response to an incident light, the first unit pixel group further including first transistor elements and first floating diffusion regions configured to store the generated photocharges; and a second unit pixel group located adjacent to the first unit pixel group and including a plurality of photoelectric conversion elements forming a second shared pixel and configured to generate photocharges in response to the incident light, the second unit pixel group further including second transistor elements and second floating diffusion regions configured to store the photocharges, wherein the first shared pixel includes some of the first transistor elements and some of the second transistor elements.

20 Claims, 9 Drawing Sheets

IMAGE SENSOR

CROSS-REFERENCE TO RELATED APPLICATION

This patent document claims priority based upon Korean patent application No. 10-2019-0096752, filed on Aug. 8, 2019, which is incorporated in its entirety by reference herein.

TECHNICAL FIELD

The technology and implementations disclosed in this patent document generally relate to an image sensor.

BACKGROUND

An image sensor is a semiconductor device for capturing light that is incident thereon to produce an image. Recently, with the increasing development of computer industries and communication industries, the demand for high-quality and high-performance image sensors in, for example, smartphones, digital cameras, game consoles, Internet of Things (IoT), robots, surveillance cameras, medical micro-cameras, etc, has been rapidly increasing.

Image sensors may be generally classified into CCD (Charge Coupled Device) image sensors and CMOS (Complementary Metal Oxide Semiconductor) image sensors. CCD image sensors have less noise and better image quality than CMOS image sensors. However, CMOS image sensors have a simpler and more convenient driving scheme. In addition, CMOS image sensors may be used to integrate a signal processing circuit in a single chip, making it easy to miniaturize the sensors for implementations in a product, with the added benefit of consuming very lower power. CMOS image sensors can be fabricated using a CMOS fabrication technology, which requires lower manufacturing costs as compared to the CCD image sensors. CMOS image sensors have been widely used due to their suitability for implementation in a mobile device.

SUMMARY

Embodiments of the disclosed technology relate to an image sensor. Some implementations of the disclosed technology can minimize the number of transistors contained in a unit pixel, and optimize the operation of a shared pixel unit.

In accordance with an embodiment of the disclosed technology, an image sensor may include a first unit pixel group provided with a plurality of photodiodes constructing a first shared pixel, and a second unit pixel group located adjacent to the first unit pixel group, and provided with a plurality of photodiodes constructing a second shared pixel. A first transistor group of the first shared pixel may be arranged in the first unit pixel group, and a second transistor group of the first shared pixel may be arranged in the second unit pixel group.

In accordance with another embodiment of the disclosed technology, an image sensor may include first to sixth unit pixels, each of which includes a single photodiode, a single floating diffusion (FD) region, and two transistors. Not only four photodiodes and four horizontal transistors contained in the first to fourth unit pixels, but also four vertical transistors contained in the third to sixth unit pixels may construct a first shared pixel. Photodiodes respectively contained in the fifth and sixth unit pixels may construct a second shared pixel.

In accordance with another embodiment of the disclosed technology, an image sensor may include first to tenth unit pixels, each of which includes a single photodiode, a single floating diffusion (FD) region, and two transistors. Not only eighth photodiodes and eighth horizontal transistors contained in the first to eighth unit pixels, but also eighth vertical transistors contained in the third to tenth unit pixels may construct a first shared pixel. Photodiodes respectively contained in the ninth and tenth unit pixels may construct a second shared pixel.

In another aspect, an image sensing device is provided to comprise: a first unit pixel group including a plurality of photoelectric conversion elements forming a first shared pixel and configured to generate photocharges in response to an incident light, the first unit pixel group further including first transistor elements and first floating diffusion regions configured to store the generated photocharges; and a second unit pixel group located adjacent to the first unit pixel group and including a plurality of photoelectric conversion elements forming a second shared pixel and configured to generate photocharges in response to the incident light, the second unit pixel group further including second transistor elements and second floating diffusion regions configured to store the photocharges, wherein the first shared pixel includes some of the first transistor elements and some of the second transistor elements.

In another aspect, an image sensing device is provided to comprise: a pixel array including unit pixels, each unit pixel including a photoelectric conversion element configured to generate photocharges in response to an incident light, a floating diffusion region configured to store the generated photocharges, and transistors arranged around the floating diffusion region, wherein the unit pixels are grouped into multiple unit pixel groups including a first unit pixel group and a second unit pixel group and a shared pixel is configured to include photoelectric conversion elements included in the first unit pixel group and transistor elements included in the second unit pixel group arranged adjacent to the first unit pixel group and to output a pixel signal corresponding to the generated photocharges.

It is to be understood that both the foregoing general description and the following detailed description of the disclosed technology are illustrative and explanatory and are intended to provide further explanation of the disclosure as claimed.

DETAILED DESCRIPTION

This patent document provides structures and techniques for image sensing devices based on a shared-pixel architecture to provide improved noise performance and to improve the image sensing. The disclosed technology can be implemented in various configurations for the shared-pixel architecture which can operate as a unit for outputting a pixel signal in response to an incident light.

Reference will now be made in detail to the embodiments of the disclosed technology, examples of which are illustrated in the accompanying drawings. Wherever possible, the same reference numbers will be used throughout the drawings to refer to the same or like parts.

Figure 1:
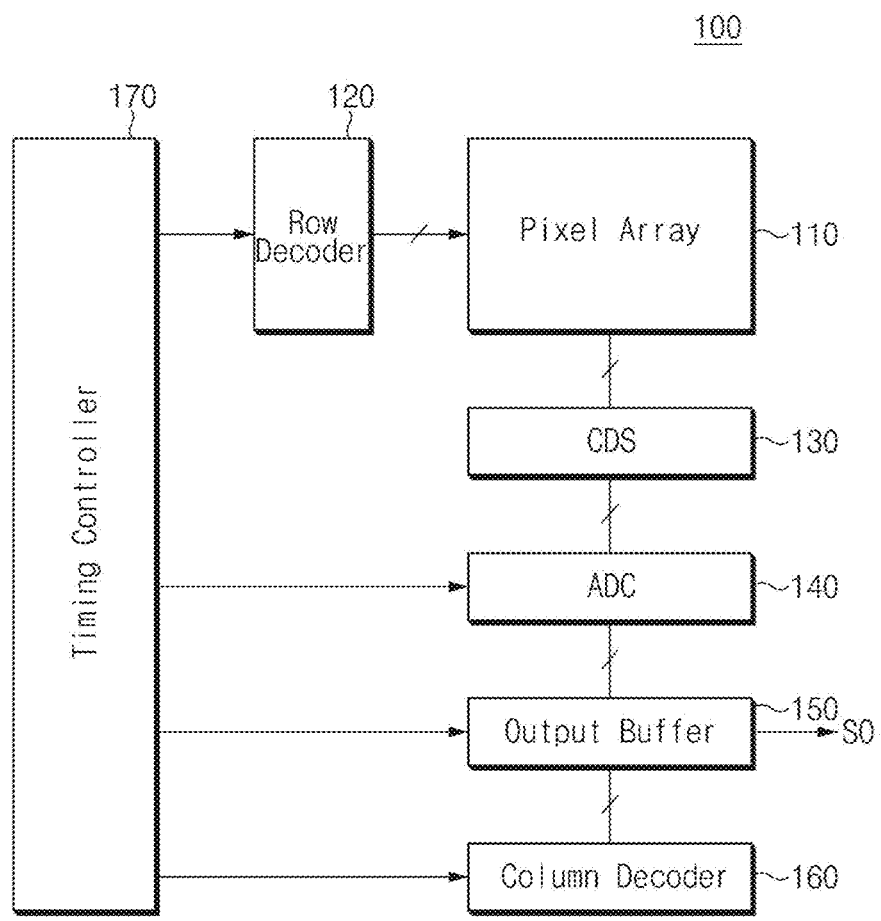
FIG. 1 is an example block diagram illustrating an image sensor based on an embodiment of the disclosed technology.

FIG. 1 is an example block diagram illustrating an image sensor 100 based on an embodiment of the disclosed technology.

Referring to FIG. 1, the image sensor 100 may include a pixel array 110, a row decoder 120, a correlated double sampling (CDS) circuit 130, an analog-to-digital converter (ADC) 140, an output buffer 150, a column decoder 160, and a timing controller 170.

While FIG. 1 shows an example of the image sensor 100 for illustration purposes, at least some elements as shown in FIG. 1 can be omitted or any additional element can be added to the image sensor 100.

The pixel array 110 may include a plurality of pixels arranged in a two-dimensional (2D) array including rows and columns. Each pixel may include a photosensing element which is configured to convert an optical signal or incident light into an electrical signal. The photosensing element may include, for example, a photodiode, a photogate, a phototransistor, a photoconductor, or some other photosensing structures capable of generating photocharges. The pixel array 110 may receive a drive signal that includes a row selection signal, a pixel reset signal, a transmission (Tx) signal, etc. from the row decoder 120, and may be driven by the drive signal received from the row decoder 120.

The row decoder 120 may drive the pixel array 110 under control of the timing controller 170. In some implementations, the row decoder 120 may select at least one row from the pixel array 110. The row decoder 120 may generate a row selection signal to select at least one of a plurality of rows. The row decoder 120 may sequentially enable a pixel reset signal for pixels corresponding to at least one selected row, and a transmission (Tx) signal for the pixels. As a result, an analog-type reference signal and an image signal that are generated from each pixel of the selected row may be sequentially transmitted to the CDS circuit 130. The reference signal and the image signal will be referred to as a pixel signal.

The CDS circuit 130 may sequentially sample and hold the reference signal and the image signal that are transferred from each of the plurality of column lines in the pixel array 110. Thus, the CDS circuit 130 may sample and hold levels of the reference signal and the image signal that correspond to each column of the pixel array 110.

The CDS circuit 130 may transmit, to the ADC 140, a correlated double sampling (CDS) signal corresponding to the reference signal and the image signal from each column of the pixel array 110 upon receiving a control signal from the timing controller 170.

The ADC 140 may receive the CDS signal corresponding to each column from the CDS circuit 130, may convert the received CDS signal into a digital signal, and may thus output the digital signal. The ADC 140 may perform counting and calculation operations based on the CDS signal for each column and a ramp signal received from the timing controller 170. Thus, the ADC 140 may generate digital image data in which noise (for example, unique reset noise for each pixel) corresponding to each column is removed.

The ADC 140 may include a plurality of column counters corresponding to respective columns of the pixel array 110, and may convert the CDS signal for each column into a digital signal using the column counters. In accordance with another embodiment, the ADC 140 may include a single global counter, and may convert a CDS signal corresponding to each column into a digital signal using a global code received from the global counter.

The output buffer 150 may receive image data for each column received from the ADC 140, may capture the received image data, and may output the captured image data. The output buffer 150 may temporarily store image data that has been output from the ADC 140 upon receiving a control signal from the timing controller 170. The output buffer 150 may operate as an interface configured to compensate for a difference in transmission (Tx) speed (or in processing speed) between the image sensor 100 and another device coupled to the image sensor 100.

The column decoder 160 may select a column of the output buffer 150 upon receiving a control signal from the timing controller 170, and may sequentially output the temporarily stored image data to the output buffer 150. In some implementations, the column decoder 160 may receive an address signal from the timing controller 170, may generate a column selection signal based on the received address signal, and may select a column of the output buffer 150. Thus, the column decoder 160 may control image data to be output as an output signal S0 from the selected column of the output buffer 150.

The timing controller 170 may control the row decoder 120, the ADC 140, the output buffer 150, and the column decoder 160.

The timing controller 170 may transmit a clock signal needed for the constituent elements of the image sensor 100, a control signal needed for timing control, and address signals needed for selection of a row or column to the row decoder 120, the column decoder 160, the ADC 140, and the output buffer 150. In accordance with the embodiment, the timing controller 170 may include a logic control circuit, a phase locked loop (PLL) circuit, a timing control circuit, a communication interface circuit, etc.

Figure 2:
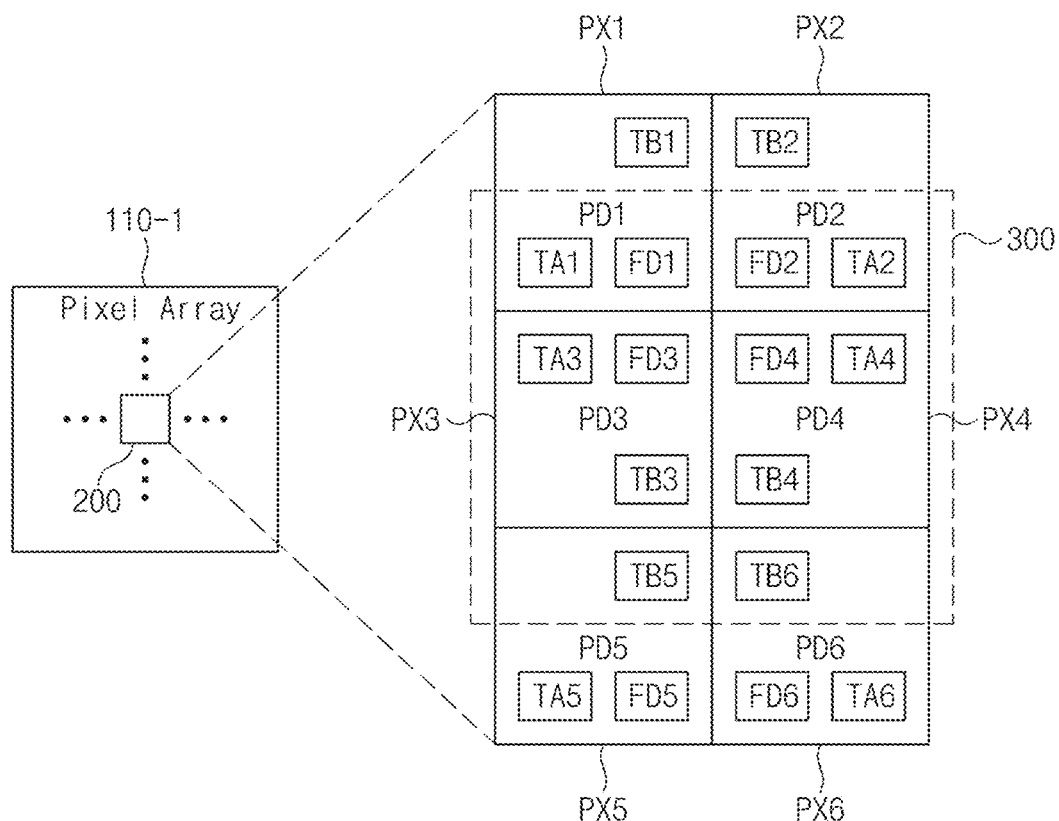
FIG. 2 is a schematic diagram illustrating one example of a pixel array shown in FIG. 1 based on the disclosed technology.

FIG. 2 is a schematic diagram illustrating one example of the pixel array shown in FIG. 1 implementing a shared-pixel architecture according to the disclosed technology.

Referring to FIG. 2, a pixel array 110-1 may illustrate an example of the pixel array 100 shown in FIG. 1. The pixel array 110-1 includes photosensing elements/pixels or unit pixels and may have a specific structure in which photosensing elements/pixels or unit pixels are divided into pixel groups and each pixel group 200 includes unit pixels that are repeatedly arranged in a matrix shape in rows and columns.

A detailed schematic diagram of each pixel group 200 is shown in the right side of FIG. 2. In the example of FIG. 2, each pixel group 200 may include 6 unit pixels PX1 to PX6.

Each of the unit pixels PX1 to PX6 may be an isolated pixel that is physically isolated from contiguous or adjacent unit pixels. Therefore, each of the unit pixels PX1 to PX6 is unable to physically share a photoelectric conversion element, a floating diffusion (FD) region, and/or a transistor with contiguous or adjacent unit pixels. For example, each of the unit pixels PX1 to PX6 may include its own photoelectric conversion element PD, floating diffusion (FD) region, or transistor.

In accordance with the embodiment, each of the unit pixels PX1 to PX6 may be an isolated pixel, and may be physically isolated from the contiguous or adjacent unit pixels by a trench-shaped isolation structure (e.g., a Shallow Trench Isolation (STI) structure, a Deep Trench Isolation (DTI) structure, a junction isolation), or other suitable isolation structures in semiconductor devices.

Each of the unit pixels PX1 to PX6 may include a Back Side Illumination (BSI) structure or a Front Side Illumination (FSI) structure.

In some implementations, elements contained in different unit pixels may be electrically connected through, for example, an electrically conductive link or path such as a metal line.

In some implementations, each of the unit pixels PX1 to PX6 may include a single photoelectric conversion element, a single floating diffusion (FD) region, and two pixel transistors. For example, the first unit pixel PX1 may include a single photoelectric conversion element PD1, a single floating diffusion (FD) region FD1, and two transistors TA1 and TB1.

Each of the photoelectric conversion elements PD1 to PD6 respectively contained in the unit pixels PX1 to PX6 may be arranged to occupy an area as large as possible, wherein the area is located within each of the unit pixels PX1 to PX6. By doing so, it is possible to increase light reception (Rx) efficiency. A method for arranging floating diffusion (FD) regions and transistors contained in the unit pixels PX1 to PX4 will hereinafter be described in detail. In this example, each of the unit pixels PX1 to PX6 may be structured to include a horizontal transistor TA1 and a vertical transistor TB2. In the unit pixel PX1, the horizontal transistor TA1 is arranged adjacent to the floating diffusion (FD) region FD1 in a horizontal direction that is generally parallel to the semiconductor substrate surface and semiconductor layers, and the vertical transistor TB1 is arranged adjacent to the floating diffusion (FD) region FD1 in a vertical direction perpendicular to or in an angle with respect to the horizontal direction. The horizontal transistor TA1 and the vertical transistor TA2 are named based on its position relative to the floating diffusion (FD) region for the easy of reference and such naming is irrelevant to other properties of the transistor such as a channel direction.

Arrangements of the floating diffusion (FD) regions and the transistors contained in the unit pixels PX5 and PX6 may be substantially identical to those of the unit pixels PX1 and PX2, and as such a detailed description thereof will herein be omitted for the concise description. Although FIG. 2 and the following description illustrate that the floating diffusion (FD) region and the transistors are arranged in three different regions of four regions that are formed by equally dividing each unit pixel, e.g., in vertical and horizontal directions. It should be noted that such arrangement is one example only and that the floating diffusion (FD) region and the transistors can be arranged in other various manners. For example, at least one of the transistors can be formed to occupy two or more regions among four regions that are obtained by equally dividing each unit pixel.

The arrangement of the floating diffusion (FD) regions will be discussed. The four floating diffusion (FD) regions FD1 to FD4, which are arranged in the four unit pixels PX1 to PX4, respectively, may be positioned as close as possible to one another. For example, the four floating diffusion (FD) regions are located around a center point of the unit pixels PX1 to PX4. Here, the center point may be an intersection point between a right side of the first unit pixel PX1 and the third unit pixel PX3 and a lower side of the first unit pixel PX1 and the second unit pixel PX2. As compared to the horizontal or vertical transistor, each of the floating diffusion (FD) regions FD1 to FD4 may be located relatively closer to the center point of the unit pixels PX1 to PX4. The horizontal or vertical transistor may be located adjacent to its corresponding floating diffusion (FD) region in a direction away from the center point of the unit pixels PX1 to PX4. The floating diffusion (FD) regions FD1 to FD4 may be coupled to one another through a metal line (not shown), thereby forming a single node. The length of the metal line depends on the arrangement of the floating diffusion (FD) regions connected through the metal line. The above arrangement that the four floating diffusion (FD) regions are positioned as close as possible to one another can minimize the length of the metal line through which the floating diffusion (FD) regions FD1 to FD4 are interconnected. This arrangement can reduce an electrical noise generated in the metal line by minimizing the length of the metal line.

Each of the horizontal transistors TA1 to TA4 respectively contained in the unit pixels PX1 to PX4 may be arranged in a horizontal direction from each of the floating diffusion (FD) regions FD1 to FD4. Each of the horizontal transistors TA1 and TA3 respectively contained in the unit pixels PX1 and PX3 may be located at the left side of the corresponding floating diffusion (FD) regions in a direction away from the center point of the unit pixels PX1 to PX4. For example, the horizontal transistor TA1 may be located at the left side of the floating diffusion (FD) region FD1, and the horizontal transistor TA3 may be located at the left side of the floating diffusion (FD) region FD3. Each of the horizontal transistors TA2 and TA4 respectively contained in the unit pixels PX2 and PX4 may be located at the right side of the corresponding floating diffusion (FD) regions in a direction away from the center point of the unit pixels PX1 to PX4. For example, the horizontal transistor TA2 may be located at the right side of the floating diffusion (FD) region FD2, and the horizontal transistor TA4 may be located at the right side of the floating diffusion (FD) region FD4.

The vertical transistors TB1 to TB4 respectively contained in the unit pixels PX1 to PX4 may be respectively arranged perpendicular to the floating diffusion (FD) regions FD1 to FD4. Each of the vertical transistors TB1 and TB2 of the unit pixels PX1 and PX2 may be located at an upper side of the corresponding floating diffusion (FD) regions FD1 and FD2 in a direction away from the center point of the unit pixels PX1 to PX4. For example, the vertical transistor TB1 may be located at the upper side of the floating diffusion (FD) region FD1, and the vertical transistor TB2 may be located at the upper side of the floating diffusion (FD) region FD2. Each of the vertical transistors TB3 and TB4 of the unit pixels PX3 and PX4 may be located at a lower side of the corresponding floating diffusion (FD) regions FD3 and FD4 in a direction away from the center point of the unit pixels PX1 to PX4. For example, the vertical transistor TB3 may be located at the lower side of the floating diffusion (FD) region FD3, and the vertical transistor TB4 may be located at the lower side of the floating diffusion (FD) region FD4.

At least some elements (e.g., photoelectric conversion elements, floating diffusion (FD) regions, horizontal transistors, vertical transistors, etc.) contained in the unit pixels PX1 to PX6 may construct a single shared pixel 300 having a 4-shared pixel structure. The 4-shared pixel structure constructing the single shared pixel 300 includes same numbers of photoelectric conversion elements, floating diffusion (FD) regions, transistors that are included in 4 unit pixels and will hereinafter be described with reference to FIGS. 2 to 4.

In the example, the shared pixel 300 has a four-shared pixel structure which includes elements of 4 photoelectric conversion elements 4 floating diffusion (FD) regions, and 8 transistors. The elements of the shared pixel 300 can be included in unit pixels PX1 to PX6. For example, the shared pixel 300 may include elements that are contained in the first to fourth unit pixels PX1 to PX4, and may further include the fifth and sixth vertical transistors TB5 and TB6 that are contained in the fifth and sixth unit pixels PX5 and PX6. The shared pixel 300 does not include the first and second vertical transistors TB1 and TB2 of the first and second unit pixels PX1 and PX2.

The reason why the shared pixel 300 is constructed as described above is to reduce electrical noise encountered in the metal line by minimizing the length of the metal line needed to electrically interconnect the transistors.

The transistors contained in the shared pixel 300 may be classified into a first group of transistors (hereinafter referred to as a first transistor group) and a second group of transistors (hereinafter referred to as a second transistor group). The first transistor group may include transistors arranged in the first to fourth unit pixels PX1 to PX4 respectively including the photoelectric conversion elements PD1 to PD4 contained in the shared pixel 300. As can be seen from the embodiment of FIG. 2, the first transistor group may include the first to fourth horizontal transistors TA1 to TA4 and the third and fourth vertical transistors TB3 and TB4. The second transistor group may include transistors arranged in the unit pixels PX5 and PX6 that are different from the first to fourth unit pixels PX1 to PX4 respectively including the photoelectric conversion elements PD1 to PD4 contained in the shared pixel 300. As can be seen from the embodiment of FIG. 2, the second transistor group may include the fifth and sixth transistors TB5 and TB6.

In accordance with another embodiment, the shared pixel 300 may also include only elements contained in the first to fourth unit pixels PX1 to PX4.

As illustrated in FIG. 2, although 6 unit pixels PX1 to PX6 may be arranged in a (3×2) structure having three rows and two columns, it should be noted that the unit pixels PX1 to PX6 can also be arranged in a (2×3) structure having two rows and three columns as needed.

The vertical transistors TB1 and TB2 of the first and second unit pixels PX1 and PX2 may construct other shared pixels together with elements contained in 4 pixels (not shown) located at the upper side of the first and second unit pixels PX1 and PX2. In this case, functions and operations of the vertical transistors TB1 and TB2 may respectively correspond to functions and operations of the vertical transistors TB5 and TB6 of the shared pixel 300.

The photoelectric conversion elements PD5 and PD6, the floating diffusion (FD) regions FD5 and FD6, and the horizontal transistors TA5 and TA6 of the fifth and sixth unit pixels PX5 and PX6 may construct other shared pixels together with elements contained in four pixels (not shown) located at a lower side of the fifth and sixth unit pixels PX5 and PX6. In this case, functions and operations of the photoelectric conversion elements PD5 and PD6, the floating diffusion (FD) regions FD5 and FD6, and the horizontal transistors TA5 and TA6 may respectively correspond to functions and operations of the photoelectric conversion elements PD1 and PD2, the floating diffusion (FD) regions FD1 and FD2, and the horizontal transistors TA1 and TA2 of the shared pixel 300.

The unit pixels included in the pixel array 110-1 can be grouped into multiple unit pixel groups. The unit pixels included in a same unit pixel group include photoelectric conversion elements constructing a same shared pixel. The first to fourth unit pixels PX1 to PX4 may be defined as a first group of unit pixels (hereinafter referred to as a first unit-pixel group). The fifth and sixth unit pixels PX5 and PX6 and two unit pixels located at the lower side of the fifth and sixth unit pixels PX5 and PX6 may be defined as a second group of unit pixels (hereinafter referred to as a second unit-pixel group). In addition, the shared pixel 300 including photoelectric conversion elements of the first to fourth unit pixels PX1 to PX4 may be defined as a first shared pixel. A shared pixel (not shown), that includes the fifth and sixth unit pixels PX5 and PX6 and photoelectric conversion elements of two unit pixels located at the lower side of the fifth and sixth unit pixels PX5 and PX6, may be defined as a second shared pixel. Therefore, the first transistor group of the first shared pixel may be arranged in the first unit-pixel group, and the second transistor group of the first shared pixel may be arranged in the second unit-pixel group.

Figure 3:
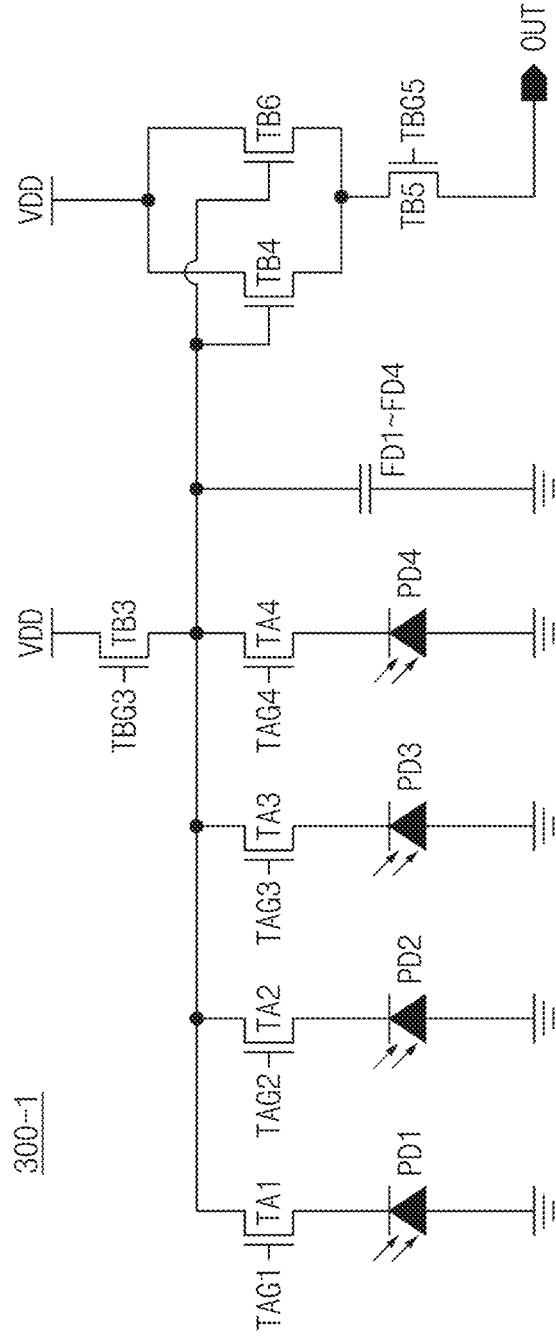
FIG. 3 is a schematic diagram illustrating one example of an equivalent circuit diagram corresponding to a shared pixel shown in FIG. 2 based on the disclosed technology.

FIG. 3 is a schematic diagram illustrating one example of an equivalent circuit diagram corresponding to the shared pixel shown in FIG. 2 according to the disclosed technology.

Referring to FIG. 3, the shared pixel 300-1 may include first to fourth photoelectric conversion elements PD1 to PD4, first to fourth horizontal transistors TA1 to TA4, first to fourth floating diffusion (FD) regions FD1 to FD4, and third to sixth vertical transistors TB3 to TB6.

Each of the first to fourth photoelectric conversion elements PD1 to PD4 may absorb incident light, and may accumulate photocharges corresponding to the amount of incident light therein. Each of the first to fourth photoelectric conversion elements PD1 to PD4 may be an example of a photoelectric conversion element. In accordance with another example, the photoelectric conversion element PD may also be implemented as a phototransistor, a photogate, a pinned photodiode or a combination thereof.

The first horizontal transistor TA1 may be coupled between the first photoelectric conversion element PD1 and the first floating diffusion (FD) region FD1. The second horizontal transistor TA2 may be coupled between the second photoelectric conversion element PD2 and the second floating diffusion (FD) region FD2. The third horizontal transistor TA3 may be coupled between the third photoelectric conversion element PD3 and the third floating diffusion (FD) region FD3. The fourth horizontal transistor TA4 may be coupled between the fourth photoelectric conversion element PD4 and the fourth floating diffusion (FD) region FD4. The first horizontal transistor TA1 may be turned on or off in response to a control signal TAG1. The second horizontal transistor TA2 may be turned on or off in response to a control signal TAG2. The third horizontal transistor TA3 may be turned on or off in response to a control signal TAG3. The fourth horizontal transistor TA4 may be turned on or off in response to a control signal TAG4. Each turned-on horizontal transistor may transmit photocharges accumulated in the corresponding photoelectric conversion element to the corresponding floating diffusion (FD) region. Each of the first to fourth horizontal transistors TA1 to TA4 may operate as a transfer transistor.

The first floating diffusion (FD) region FD1 may receive photocharges of the first photoelectric conversion element PD1 through the first horizontal transistor TA1, and may accumulate the received photocharges of the first photoelectric conversion element PD1. The second floating diffusion (FD) region FD2 may receive photocharges of the second photoelectric conversion element PD2 through the second horizontal transistor TA2, and may accumulate the received photocharges of the second photoelectric conversion element PD2. The third floating diffusion (FD) region FD3 may receive photocharges of the third photoelectric conversion element PD3 through the third horizontal transistor TA3, and may accumulate the received photocharges of the third photoelectric conversion element PD3. The fourth floating diffusion (FD) region FD4 may receive photocharges of the fourth photoelectric conversion element PD4 through the fourth horizontal transistor TA4, and may accumulate the received photocharges of the fourth photoelectric conversion element PD4. The first to fourth floating diffusion (FD) regions FD1 to FD4 may be electrically coupled to one another, and may thus be modeled as a single junction capacitor.

The third vertical transistor TB3 may be coupled between a power-supply voltage VDD and each of the first to fourth floating diffusion (FD) regions FD1 to FD4, and an electric potential of the first to fourth floating diffusion (FD) regions FD1 to FD4 may be reset to the power-supply voltage VDD in response to a control signal TBG3. The third vertical transistor TB3 may operate as a reset transistor.

The fourth and sixth vertical transistors TB4 and TB6 may amplify a change in electrical potential of the first to fourth floating diffusion (FD) regions FD1 to FD4 that respectively receive photocharges accumulated in the first to fourth photoelectric conversion elements PD1 to PD4, and may transmit the amplified potential to the fifth vertical transistor TB5. Gate regions, source regions, and drain regions of the fourth and sixth vertical transistors TB4 and TB6 may be electrically coupled to one another. Therefore, the fourth and sixth vertical transistors TB4 and TB6 may operate as a single source follower transistor.

The fourth vertical transistor TB4 may construct the source follower transistor along with the sixth vertical transistor TB6 instead of the fifth vertical transistor TB5. In more detail, as can be seen from the layout diagram of FIG. 2, the method for forming parallel connection between the fourth vertical transistor TB4 and the sixth vertical transistor TB6 can minimize a total length of metal lines, resulting in reduction in noise.

In the event that a single source follower transistor is composed of the fourth and sixth vertical transistors TB4 and TB6 instead of the single vertical transistor, even when a region in which at least one transistor can be arranged has a relatively small width due to the region of a miniaturized unit pixel, the fourth and sixth vertical transistors TB4 and TB6 coupled in parallel may operate as a single source follower transistor having a relatively large channel width. Therefore, transconductance of the source follower transistor can be improved, such that a signal transmission (Tx) speed of the shared pixel 300-1 can be increased.

The fifth vertical transistor TB5 may select a shared pixel to be read in the unit of a row. The fifth vertical transistor TB5 may be turned on by a control signal TBG5 corresponding to the fifth vertical transistor TB5, so that the signal corresponding to the electric potential change of the first to fourth floating diffusion (FD) regions FD1 to FD4 provided to a drain (i.e., a source of the source follower transistor) of the fifth vertical transistor TB5 can be output as an output voltage OUT. The fifth vertical transistor TB5 may operate as a selection transistor.

The output voltage OUT (OUT1 to OUT4, etc.) of the selection transistor may correspond to a reference signal (e.g., a signal corresponding to the reset floating diffusion (FD) region) depicted in FIG. 1 and an image signal (e.g., a signal corresponding to the floating diffusion (FD) region in which photocharges received from the photoelectric conversion element are accumulated).

Each of the first to fourth horizontal transistors TA1 to TA4 respectively adjacent to the first to fourth floating diffusion (FD) regions FD1 to FD4 may operate as a transfer transistor, and each of the third to sixth vertical transistors TB3 to TB5 may operate as a reset transistor, a source follower transistor, or a selection transistor. Thus, the length of metal lines can be minimized and transmission (Tx) efficiency of photocharges can be increased.

Figure 4:
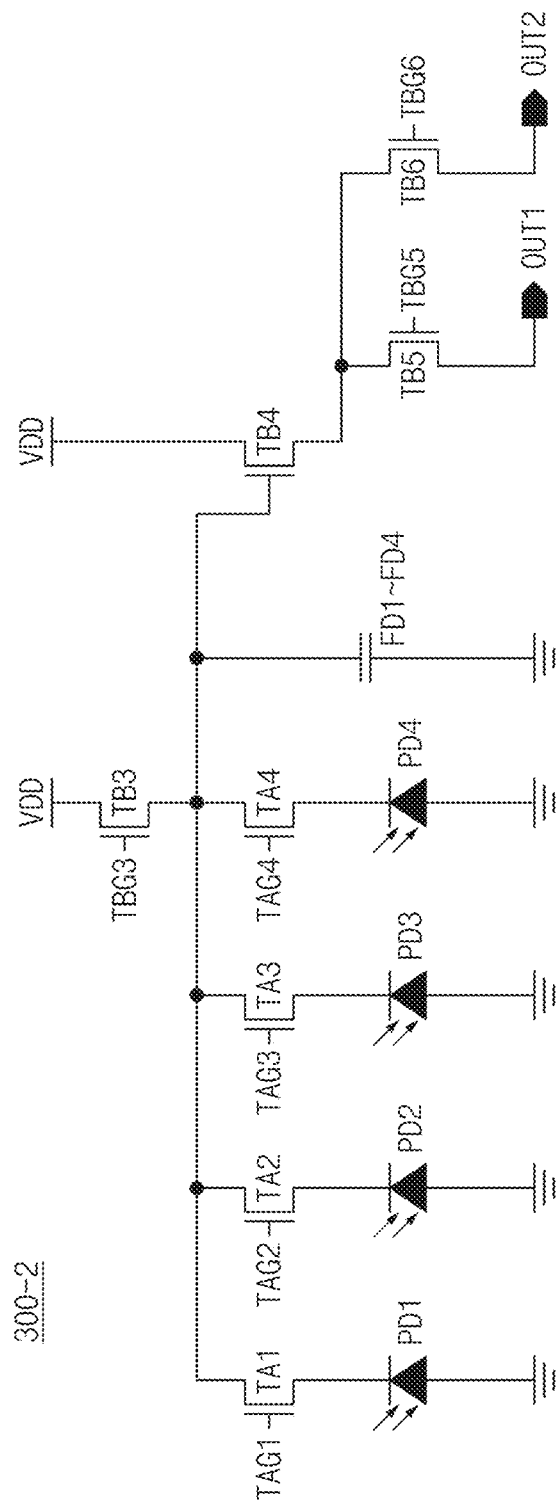
FIG. 4 is a schematic diagram illustrating another example of an equivalent circuit diagram corresponding to a shared pixel shown in FIG. 2 based on the disclosed technology.

FIG. 4 is a schematic diagram illustrating another example of an equivalent circuit diagram corresponding to the shared pixel shown in FIG. 2 according to the disclosed technology.

Referring to FIG. 4, the shared pixel 300-2 may include first to fourth photoelectric conversion elements PD1 to PD4, first to fourth horizontal transistors TA1 to TA4, first to fourth floating diffusion (FD) regions FD1 to FD4, and third to sixth vertical transistors TB3~TB6.

The first to fourth photoelectric conversion elements PD1 to PD4, the first to fourth horizontal transistors TA1~TA4, the first to fourth floating diffusion (FD) regions FD1 to FD4, and the third vertical transistor TB3 contained in the shared pixel 300-2 shown in FIG. 4 may be identical in function and connection relationship to those of the shared pixel 300-1 shown in FIG. 3, and as such a detailed description thereof will herein be omitted for convenience of description and better understanding of the disclosed technology.

The fourth vertical transistor TB4 may amplify a change in electrical potential of the first to fourth floating diffusion (FD) regions FD1~FD4 that respectively receive photocharges accumulated in the first to fourth photoelectric conversion elements PD1 to PD4, and may transmit the amplified potential to the fifth and sixth vertical transistors TB5 and TB6. Therefore, the fourth vertical transistor TB4 may operate as a source follower transistor.

The fifth and sixth vertical transistors TB5 and TB6 may select a shared pixel to be read in units of a row. The fifth and sixth vertical transistors TB5 and TB6 may be respectively turned on by control signals TBG5 and TBG6 respectively corresponding to the fifth and sixth vertical transistors TB5 and TB6, so that a signal corresponding to the electric potential change of the first to fourth floating diffusion (FD) regions FD1~FD4 provided to a drain (i.e., a source of the source follower transistor) of each of the fifth and sixth vertical transistors TB5 and TB6 can be output as an output voltage OUT1 or OUT2. That is, each of the fifth and sixth vertical transistors TB5 and TB6 may operate as a selection transistor.

As illustrated in FIG. 4, the fifth and sixth vertical transistors TB5 and TB6 are not coupled in parallel to each other, and are turned on in different time sections in response to independent control signals TBG5 and TBG6, such that the fifth vertical transistor TB5 may output the output voltage OUT1 and the sixth vertical transistor TB6 may output the output voltage OUT2.

After the signal corresponding to the electric potential change of the first to fourth floating diffusion (FD) regions FD1~FD4 has been output as an output voltage of a column line (not shown), the column line (not shown) may be reset to receive a signal corresponding to the electric potential change of the first to fourth floating diffusion (FD) regions FD1~FD4 in a subsequent time section. In this case, a time duration needed to reset the column line (not shown) may be relatively longer than a time duration in which photocharges are generated and transferred in the shared pixel, Therefore, the operation time of the shared pixel may unavoidably increase due to the time duration needed to reset the column line (not shown), such that it may be difficult for the shared pixel 300-2 to operate at a high speed.

However, as depicted in FIG. 4, in a situation in which the fifth and sixth vertical transistors TB5 and TB6 are coupled to independent column lines in a manner that the fifth and sixth vertical transistors TB5 and TB6 respectively output the output voltages OUT1 and OUT2 in an alternate manner, the shared pixel may operate at a high speed without restricting the reset time of the column line.

In addition, each of the first to fourth horizontal transistors TA1 to TA4 respectively adjacent to the first to fourth floating diffusion (FD) regions FD1 to FD4 may operate as a transfer transistor, and each of the third to sixth vertical transistors TB3 to TB6 may operate as another transistor (e.g., a reset transistor, a source follower transistor, or a selection transistor), so that the length of metal lines can be minimized and transmission (Tx) efficiency of photocharges can be increased.

In accordance with another embodiment, the fifth vertical transistor TB5 may operate as the source follower transistor, and the fourth and sixth vertical transistors TB4 and TB6 may be coupled in parallel and may thus operate as a single selection transistor. In this case, whereas the output voltage is output to a single column line, the fourth and sixth vertical transistors TB4 and TB6 coupled in parallel may operate as a single selection transistor having a relatively large channel width. As a result, resistance of the selection transistor when viewed from the column line (not shown) may be reduced, and RC delay affected by such resistance of the selection transistor may also be reduced, such that a signal transmission (Tx) speed of the shared pixel 300-2 may increase.

Figure 5:
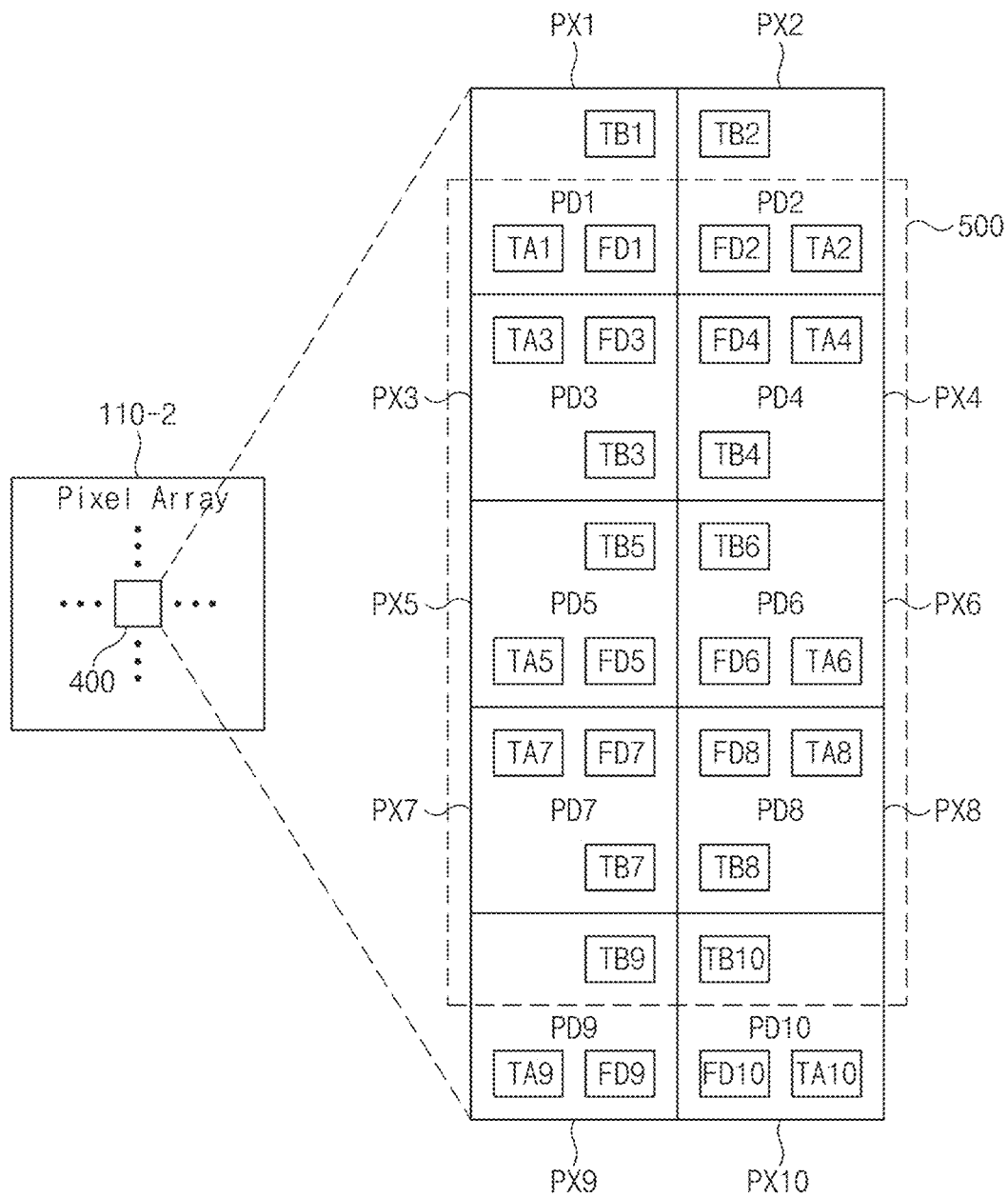
FIG. 5 is a schematic diagram illustrating another example of the pixel array shown in FIG. 1 based on the disclosed technology.

FIG. 5 is a schematic diagram illustrating another example of the pixel array shown in FIG. 1 according to the disclosed technology.

Referring to FIG. 5, the pixel array 110-2 may illustrate another example of the pixel array 100 shown in FIG. 1. The pixel array 110-2 may have a specific structure in which each pixel group 400 is repeatedly arranged in a matrix shape including rows and columns.

A detailed schematic diagram of each pixel group 400 is shown in the right side of FIG. 5. Each pixel group 200 may include 10 unit pixels PX1 to PX10.

Each of the unit pixels PX1 to PX10 may be an isolated pixel that is physically isolated from contiguous or adjacent unit pixels. In addition, each of the unit pixels PX1 to PX10 may include a Back Side Illumination (BSI) structure or a Front Side Illumination (FSI) structure.

In some implementations, elements contained in different unit pixels may be electrically connected through, for example, a metal line.

Each of the unit pixels PX1 to PX10 may include a single photoelectric conversion element, a single floating diffusion (FD) region, and two pixel transistors. For example, the first unit pixel PX1 may include a single photoelectric conversion element PD1, a single floating diffusion (FD) region FD1, and two transistors TA1 and TB1.

Arrangement of the floating diffusion (FD) regions and the transistors contained in the unit pixels PX1 to PX4 shown in FIG. 5 and arrangement of the floating diffusion (FD) regions and the transistors contained in the unit pixels PX5 to PX8 shown in FIG. 5 may be substantially identical to those of the unit pixels PX1 to PX4 shown in FIG. 2, and as such a detailed description thereof will herein be omitted for convenience of description. In addition, arrangement of the floating diffusion (FD) regions and the transistors contained in the unit pixels PX9 and PX10 may be substantially identical to those of the unit pixels PX1 and PX2, and as such a detailed description thereof will herein be omitted.

At least some elements (e.g., photoelectric conversion elements, floating diffusion (FD) regions, horizontal transistors, vertical transistors, etc.) contained in the unit pixels PX1 to PX10 may construct a single shared pixel 500 having an 8-shared pixel structure. The 8-shared pixel structure constructing the single shared pixel 500 includes same numbers of photoelectric conversion elements, FD regions, transistors that are included in 8 unit pixels and will hereinafter be described with reference to FIGS. 5 to 9.

In the example, the shared pixel 500 has a 8 shared pixel structure which includes elements of 8 photoelectric conversion elements, 8 floating diffusion (FD) regions, and 16 transistors. The elements of the shared pixel 500 can be included in unit pixels PX1 to PX10. For example, the shared pixel 500 may include elements that are contained in the first to eighth unit pixels PX1 to PX8, and may further include the ninth and tenth vertical transistors TB9 and TB10 that are contained in the ninth and tenth unit pixels PX9 and PX10. The shared pixel 500 does not include the first and second vertical transistors TB1 and TB2 of the first and second unit pixels PX1 and PX2.

The reason why the shared pixel 500 is constructed as described above is to reduce electrical noise encountered in the metal line by minimizing the length of metal lines needed to electrically interconnect the transistors.

The transistors contained in the shared pixel 500 may be classified into a first group of transistors (hereinafter referred to as a first transistor group) and a second group of transistors (hereinafter referred to as a second transistor group). The first transistor group may include transistors arranged in the first to eighth unit pixels PX1 to PX8 respectively including the photoelectric conversion elements PD1 to PD8 contained in the shared pixel 500. As can be seen from the embodiment of FIG. 5, the first transistor group may include the first to eighth horizontal transistors TA1 to TA8 and the third to eighth vertical transistors TB3~TB8. The second transistor group may include transistors arranged in the unit pixels PX9 and PX10 that are different from the first to eighth unit pixels PX1 to PX8 respectively including the photoelectric conversion elements PD1 to PD8 contained in the shared pixel 500. As can be seen from the embodiment of FIG. 5, the second transistor group may include the ninth and tenth transistors TB9 and TB10.

In accordance with another embodiment, the shared pixel 500 may also include only elements contained in the first to eighth unit pixels PX1 to PX8.

As illustrated in FIG. 5, although 10 unit pixels PX1 to PX10 may be arranged in a (5×2) structure having five rows and two columns, it should be noted that the unit pixels PX1 to PX10 can also be arranged in a (2×5) structure having two rows and five columns.

The vertical transistors TB1 and TB2 of the first and second unit pixels PX1 and PX2 may construct other shared pixels together with elements contained in 8 pixels (not shown) located at the upper side of the first and second unit pixels PX1 and PX2. In this case, functions and operations of the vertical transistors TB1 and TB2 may respectively correspond to functions and operations of the vertical transistors TB9 and TB10 of the shared pixel 500.

The photoelectric conversion elements PD9 and PD10, the floating diffusion (FD) regions FD9 and FD10, and the horizontal transistors TA9 and TA10 of the ninth and tenth unit pixels PX9 and PX10 may construct other shared pixels together with elements contained in 8 pixels (not shown) located at the lower side of the ninth and tenth unit pixels PX9 and PX10. In this case, functions and operations of the photoelectric conversion elements PD9 and PD10, the floating diffusion (FD) regions FD9 and FD10, and the horizontal transistors TA9 and TA10 may respectively correspond to functions and operations of the photoelectric conversion elements PD1 and PD2, the floating diffusion (FD) regions FD1 and FD2, and the horizontal transistors TA1 and TA2 of the shared pixel 500.

The first to eighth unit pixels PX1 to PX8 may be defined as a first group of unit pixels (hereinafter referred to as a first unit-pixel group). The ninth and tenth unit pixels PX9 and PX10 and six unit pixels located at the lower side of the ninth and tenth unit pixels PX9 and PX10 may be defined as a second group of unit pixels (hereinafter referred to as a second unit-pixel group). In addition, the shared pixel 500 including photoelectric conversion elements of the first to eighth unit pixels PX1 to PX8 may be defined as a first shared pixel. A shared pixel (not shown), that includes the ninth and tenth unit pixels PX9 and PX10 and photoelectric conversion elements of six unit pixels located at the lower side of the ninth and tenth unit pixels PX9 and PX10, may be defined as a second shared pixel. Therefore, the first transistor group of the first shared pixel may be arranged in the first unit-pixel group, and the second transistor group of the first shared pixel may be arranged in the second unit-pixel group.

Figure 6:
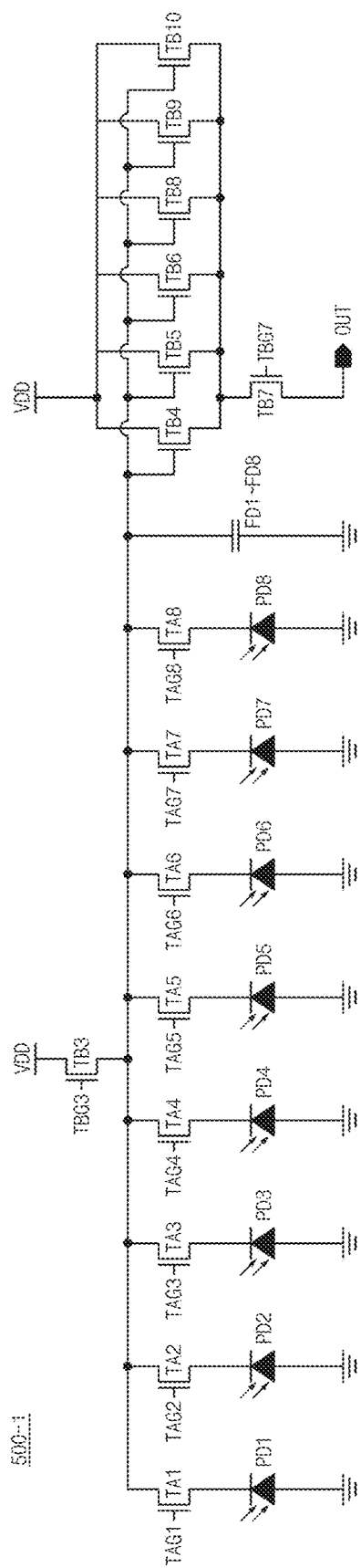
FIG. 6 is a schematic diagram illustrating one example of an equivalent circuit diagram corresponding to a shared pixel shown in FIG. 5 based on the disclosed technology.

FIG. 6 is a schematic diagram illustrating one example of an equivalent circuit diagram corresponding to the shared pixel shown in FIG. 5 according to the disclosed technology.

Referring to FIG. 6, the shared pixel 500-1 may include first to eighth photoelectric conversion elements PD1 to PD8, first to eighth horizontal transistors TA1 to TA8, first to eighth floating diffusion (FD) regions FD1 to FD8, and third to tenth vertical transistors TB3 to TB10.

Each of the first to eighth photoelectric conversion elements PD1 to PD8 may absorb incident light, and may accumulate photocharges corresponding to the amount of incident light therein. Each of the first to eighth photoelectric conversion elements PD1 to PD8 may be an example of a photoelectric conversion element. In accordance with another example, the photoelectric conversion element PD may also be implemented as a phototransistor, a photogate, a pinned photodiode or a combination thereof.

The first horizontal transistor TA1 may be coupled between the first photoelectric conversion element PD1 and the first floating diffusion (FD) region FD1. The second horizontal transistor TA2 may be coupled between the photoelectric conversion element PD2 and the second floating diffusion (FD) region FD2. The third horizontal transistor TA3 may be coupled between the third photoelectric conversion element PD3 and the third floating diffusion (FD) region FD3. The fourth horizontal transistor TA4 may be coupled between the fourth photoelectric conversion element PD4 and the fourth floating diffusion (FD) region FD4. The fifth horizontal transistor TA5 may be coupled between the fifth photoelectric conversion element PD5 and the fifth floating diffusion (FD) region FD5. The sixth horizontal transistor TA6 may be coupled between the sixth photoelectric conversion element PD6 and the sixth floating diffusion (FD) region FD6. The seventh horizontal transistor TA7 may be coupled between the seventh photoelectric conversion element PD7 and the seventh floating diffusion (FD) region FD7. The eighth horizontal transistor TA8 may be coupled between the eighth photoelectric conversion element PD8 and the eighth floating diffusion (FD) region FD8. The first horizontal transistor TA1 may be turned on or off in response to a control signal TAG1. The second horizontal transistor TA2 may be turned on or off in response to a control signal TAG2. The third horizontal transistor TA3 may be turned on or off in response to a control signal TAG3. The fourth horizontal transistor TA4 may be turned on or off in response to a control signal TAG4. The fifth horizontal transistor TA5 may be turned on or off in response to a control signal TAG5. The sixth horizontal transistor TA6 may be turned on or off in response to a control signal TAG6. The seventh horizontal transistor TA7 may be turned on or off in response to a control signal TAG7. The eighth horizontal transistor TA8 may be turned on or off in response to a control signal TAG8. Each turned-on horizontal transistor may transmit photocharges accumulated in the corresponding photoelectric conversion element to the corresponding floating diffusion (FD) region. That is, each of the first to eighth horizontal transistors TA1~TA8 may operate as a transfer transistor.

The first floating diffusion (FD) region FD1 may receive photocharges of the first photoelectric conversion element PD1 through the first horizontal transistor TA1, and may accumulate the received photocharges of the first photoelectric conversion element PD1. The second floating diffusion (FD) region FD2 may receive photocharges of the second photoelectric conversion element PD2 through the second horizontal transistor TA2, and may accumulate the received photocharges of the second photoelectric conversion element PD2. The third floating diffusion (FD) region FD3 may receive photocharges of the third photoelectric conversion element PD3 through the third horizontal transistor TA3, and may accumulate the received photocharges of the third photoelectric conversion element PD3. The fourth floating diffusion (FD) region FD4 may receive photocharges of the fourth photoelectric conversion element PD4 through the fourth horizontal transistor TA4, and may accumulate the received photocharges of the fourth photoelectric conversion element PD4. The fifth floating diffusion (FD) region FD5 may receive photocharges of the fifth photoelectric conversion element PD5 through the fifth horizontal transistor TA5, and may accumulate the received photocharges of the fifth photoelectric conversion element PD5. The sixth floating diffusion (FD) region FD6 may receive photocharges of the sixth photoelectric conversion element PD6 through the sixth horizontal transistor TA6, and may accumulate the received photocharges of the sixth photoelectric conversion element PD6. The seventh floating diffusion (FD) region FD7 may receive photocharges of the seventh photodiode PD7 through the seventh horizontal transistor TA7, and may accumulate the received photocharges of the seventh photoelectric conversion element PD7. The eighth floating diffusion (FD) region FD8 may receive photocharges of the eighth photoelectric conversion element PD8 through the eighth horizontal transistor TA8, and may accumulate the received photocharges of the eighth photoelectric conversion element PD8. The first to eighth floating diffusion (FD) regions FD1 to FD8 may be electrically coupled to one another, and may thus be modeled as a single junction capacitor.

The third vertical transistor TB3 may be coupled between a power-supply voltage VDD and each of the first to eighth floating diffusion (FD) regions FD1 to FD8, and an electric potential of the first to eighth floating diffusion (FD) regions FD1 to FD8 may be reset to the power-supply voltage VDD in response to a control signal TBG3. That is, the third vertical transistor TB3 may operate as a reset transistor.

The fourth to sixth vertical transistors TB4 to TB6 and the eighth to tenth vertical transistors TB8 to TB10 may amplify a change in electrical potential of the first to eighth floating diffusion (FD) regions FD1 to FD8 that respectively receive photocharges accumulated in the first to eighth photoelectric conversion elements PD1 to PD8, and may transmit the amplified potential to the seventh vertical transistor TB7. Gate regions, source regions, and drain regions of the fourth to sixth vertical transistors TB4 to TB6 and the eighth to tenth vertical transistors TB8 to TB10 may be electrically coupled to one another. Therefore, the fourth to sixth vertical transistors TB4 to TB6 and the eighth to tenth vertical transistors TB8 to TB10 may operate as a single source follower transistor.

On the other hand, the seventh vertical transistor TB7 is not contained in the source follower transistor. In more detail, as can be seen from the layout diagram of FIG. 5, the method for excluding the seventh vertical transistor TB7 located in a region similar to the third vertical transistor TB3 in a manner that the fourth to sixth vertical transistors TB4~TB6 and the eighth to tenth vertical transistors TB8~TB10 are formed in a source follower transistor can synthetically simplify the structure of metal lines, resulting in a minimum length of metal lines.

In addition, in the event that a single source follower transistor is composed of the fourth to sixth vertical transistors TB4 to TB6 and the eighth to tenth vertical transistors TB8 to TB10 instead of only one vertical transistor, even when a region in which at least one transistor can be arranged has a relatively small width due to the region of a miniaturized unit pixel, the fourth to sixth vertical transistors TB4 to TB6 and the eighth to tenth vertical transistors TB8 to TB10 coupled in parallel may operate as a single source follower transistor having a relatively large channel width. Therefore, transconductance of the source follower transistor can be improved, such that a signal transmission (Tx) speed of the shared pixel 300-1 can be increased.

The seventh vertical transistor TB7 may select a shared pixel to be read in units of a row. The seventh vertical transistor TB7 may be turned on by a control signal TBG7 corresponding to the seventh vertical transistor TB7, so that the signal corresponding to the electric potential change of the first to eighth floating diffusion (FD) regions FD1 to FD8 provided to a drain (i.e., a source of the source follower transistor) of the seventh vertical transistor T137 can be output as an output voltage OUT. That is, the seventh vertical transistor TB7 may operate as a selection transistor.

In addition, each of the first to eighth horizontal transistors TA1 to TA8 respectively adjacent to the first to eighth floating diffusion (FD) regions FD1 to FD8 may operate as a transfer transistor, and each of the third to tenth vertical transistors TB3 to TB10 may operate as another transistor (e.g., a reset transistor, a source follower transistor, or a selection transistor), so that the length of metal lines can be minimized and transmission (Tx) efficiency of photocharges can be increased.

Figure 7:
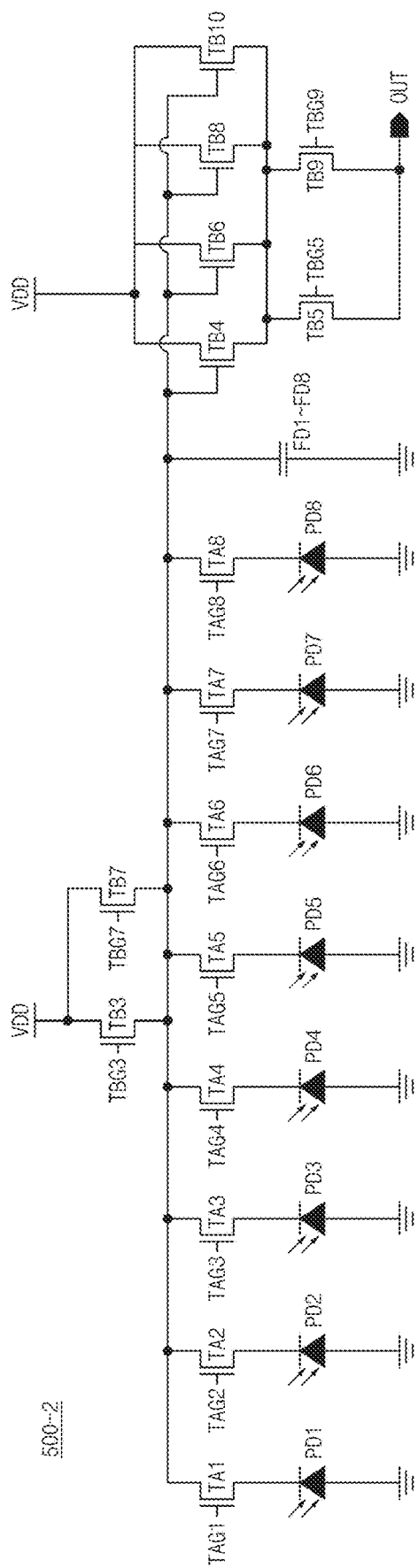
FIG. 7 is a schematic diagram illustrating another example of an equivalent circuit diagram corresponding to a shared pixel shown in FIG. 5 based on the disclosed technology.

FIG. 7 is a schematic diagram illustrating another example of an equivalent circuit diagram corresponding to a shared pixel shown in FIG. 5 according to the disclosed technology.

Referring to FIG. 7, the shared pixel 500-2 may include first to eighth photoelectric conversion elements PD1 to PD8, first to eighth horizontal transistors TA1 to TA8, first to eighth floating diffusion (FD) regions FD1 to FD8, and third to tenth vertical transistors TB3 to TB10.

The first to eighth photoelectric conversion elements PD1 to PD8, the first to eighth horizontal transistors TA1 to TA8, and the first to eighth floating diffusion (FD) regions FD1 to FD8 contained in the shared pixel 500-2 shown in FIG. 7 may be identical in function and connection relationship to those of the shared pixel 500-1 shown in FIG. 6, and as such a detailed description thereof will herein be omitted for convenience of description and better understanding of the disclosed technology.

The third and seventh vertical transistors TB3 and TB7 may be coupled between the power-supply voltage VDD and each of the first to eighth floating diffusion (FD) regions FD1 to FD8, and electric potential of the first to eighth floating diffusion (FD) regions FD1 to FD8 may be reset to the power-supply voltage VDD in response to control signals TBG3 and TBG7. Therefore, the third and seventh vertical transistors TB3 and TB7 may operate as a reset transistor.

In the event that a single reset transistor is composed of the third and seventh vertical transistors TB3 and TB7 instead of only one vertical transistor, even when a region in which at least one transistor can be arranged has a relatively small width due to the region of a miniaturized unit pixel, the third and seventh vertical transistors TB3 and TB7 coupled in parallel may operate as a single reset transistor having a relatively large channel width. Therefore, transconductance of the reset transistor can be improved, such that a reset speed of the third and seventh vertical transistors TB3 and TB7 can be increased.

In addition, as can be seen from the layout diagram of FIG. 5, the first to fourth floating diffusion (FD) regions FD1 to FD4 may be physically spaced apart from the fifth to eighth floating diffusion (FD) regions FD5 to FD8 by a predetermined distance. The first to fourth floating diffusion (FD) regions FD1 to FD4 may be coupled to the third vertical transistor TB3 acting as a reset transistor. Here, the reset transistor indicating the third vertical transistor TB3 may be physically located closer to the first to fourth floating diffusion (FD) regions FD1 to FD4. The fifth to eighth floating diffusion (FD) regions FD5 to FD8 may be coupled to the seventh vertical transistor TB7 acting as a reset transistor. Here, the reset transistor indicating the seventh vertical transistor TB7 may be physically located closer to the fifth to eighth floating diffusion (FD) regions FD5 to FD8. As a result, a reset speed can be greatly increased.

The fourth, sixth, eighth, and tenth vertical transistors TB4, TB6, TB8, and TB10 may amplify a change in electrical potential of the first to eighth floating diffusion (FD) regions FD1 to FD8 that respectively receive photocharges accumulated in the first to eighth photoelectric conversion elements PD1 to PD8, and may transmit the amplified potential to the fifth and ninth vertical transistor TB5 and TB9. Gate regions, source regions, and drain regions of the fourth, sixth, eighth, and tenth vertical transistors TB4, TB6, TB8, and TB10 may be electrically coupled to one another. Therefore, the fourth, sixth, eighth, and tenth vertical transistors TB4, TB6, TB8, and TB10 may operate as a single source follower transistor.

On the other hand, the fourth vertical transistor TB4, the sixth vertical transistor TB6, the eighth vertical transistor TB8, and the tenth vertical transistor TB10 may construct the source follower transistor. In more detail, as can be seen from the layout diagram of FIG. 5, the reason why the source follower transistor is constructed as described above is to minimize a total length of metal lines, resulting in reduction in noise.

The fifth and ninth vertical transistors TB5 and TB9 may select a shared pixel to be read in units of a row. The fifth and ninth vertical transistors TB5 and TB9 may be turned on by control signals TBG5 and TBG9 respectively corresponding to the fifth and ninth vertical transistors TB5 and TB9, so that the signal corresponding to the electric potential change of the first to eighth floating diffusion (FD) regions FD1 to FD8 provided to a drain (i.e., a source of the source follower transistor) of each of the fifth and ninth vertical transistors TB5 and TB9 can be output as an output voltage OUT. That is, each of the fifth and ninth vertical transistors TB5 and TB9 may operate as a selection transistor.

As illustrated in FIG. 7, gates, sources, and drains of the fifth and ninth vertical transistors TB5 and TB9 are coupled to one another, the output voltage OUT is output to a single column line (not shown), and the fifth and ninth vertical transistors TB5 and TB9 coupled in parallel may operate as a single selection transistor having a relatively large channel width. As a result, resistance of the selection transistor when viewed from the column line (not shown) may be reduced, and RC delay affected by such resistance of the selection transistor may also be reduced, such that a signal transmission (Tx) speed of the shared pixel 500-2 may increase.

In addition, as can be seen from the layout diagram of FIG. 5, the fourth and sixth vertical transistors TB4 and TB6 may be physically spaced apart from the eighth and tenth vertical transistors TB8 and TB10 by a predetermined distance. The fourth and sixth vertical transistors TB4 and TB6 may be coupled to the fifth vertical transistor TB5 acting as a selection transistor. Here, the selection transistor indicating the fifth vertical transistor TB5 may be physically located closer to the fourth and sixth vertical transistors TB4 and TB6. The eighth and tenth vertical transistors TB8 and TB10 may be coupled to the ninth vertical transistor TB9 acting as a selection transistor. Here, the reset transistor indicating the ninth vertical transistor TB9 may be physically located closer to the eighth and tenth vertical transistors TB8 and TB10. As a result, a signal transmission (Tx) speed can be greatly increased.

Figure 8:
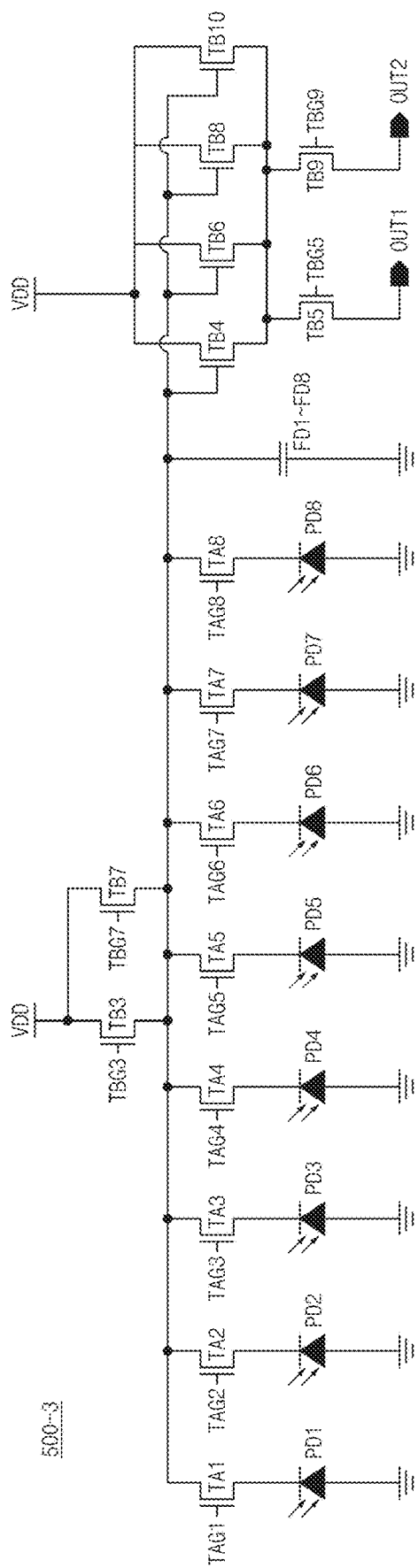
FIG. 8 is a schematic diagram illustrating another example of an equivalent circuit diagram corresponding to a shared pixel shown in FIG. 5 based on the disclosed technology.

FIG. 8 is a schematic diagram illustrating another example of an equivalent circuit diagram corresponding to a shared pixel shown in FIG. 5 according to the disclosed technology.

Referring to FIG. 8, the shared pixel 500-3 may include first to eighth photoelectric conversion elements PD1 to PD8, first to eighth horizontal transistors TA1~TA8, first to eighth floating diffusion (FD) regions FD1~FD8, and third to tenth vertical transistors TB3~TB10.

The remaining vertical transistors TB3, TB4, TB6, TB7, TB8, and TB10 other than the first to eighth photoelectric conversion elements PD1 to PD8, the first to eighth hori-zontal transistors TA1 to TA8, the first to eighth floating diffusion (FD) regions FD1 to FD8, and the fifth and ninth vertical transistors TB5 and TB9 contained in the shared pixel 500-3 depicted in FIG. 8 may be identical in function and connection relationship to those of the shared pixel 500-2 shown in FIG. 7, and as such a detailed description thereof will herein be omitted for convenience of description and better understanding of the disclosed technology.

As illustrated in FIG. 8, whereas the fifth and ninth vertical transistors T135 and TB9 may operate as a selection transistor, the fifth and ninth vertical transistors TB5 and TB9 are not coupled in parallel to each other in a different way from FIG. 7, and are turned on in different time sections in response to independent control signals TBG5 and TBG9, such that the fifth vertical transistors TB5 may output the output voltage OUT1 and the ninth vertical transistor TB9 may output the output voltage OUT2.

After the signal corresponding to the electric potential change of the first to eighth floating diffusion (FD) regions FD1~FD8 has been output as an output voltage of a column line (not shown), the column line (not shown) may be reset to receive a signal corresponding to the electric potential change of the first to eighth floating diffusion (FD) regions FD1~FD8 in a subsequent time section. In this case, a time duration needed to reset the column line (not shown) may be relatively longer than a time duration in which photocharges are generated and transferred in the shared pixel. Therefore, the operation time of the shared pixel may unavoidably increase due to the time duration needed to reset the column line (not shown), such that it may be difficult for the shared pixel 500-3 to operate at a high speed.

However, as depicted in FIG. 8, in a situation in which the fifth and ninth vertical transistors TB5 and TB9 are coupled to independent column lines in a manner that the fifth and ninth vertical transistors TB5 and TB9 respectively output the output voltages OUT1 and OUT2 in an alternate manner, the shared pixel may operate at a high speed without restricting the reset time of the column line.

Figure 9:
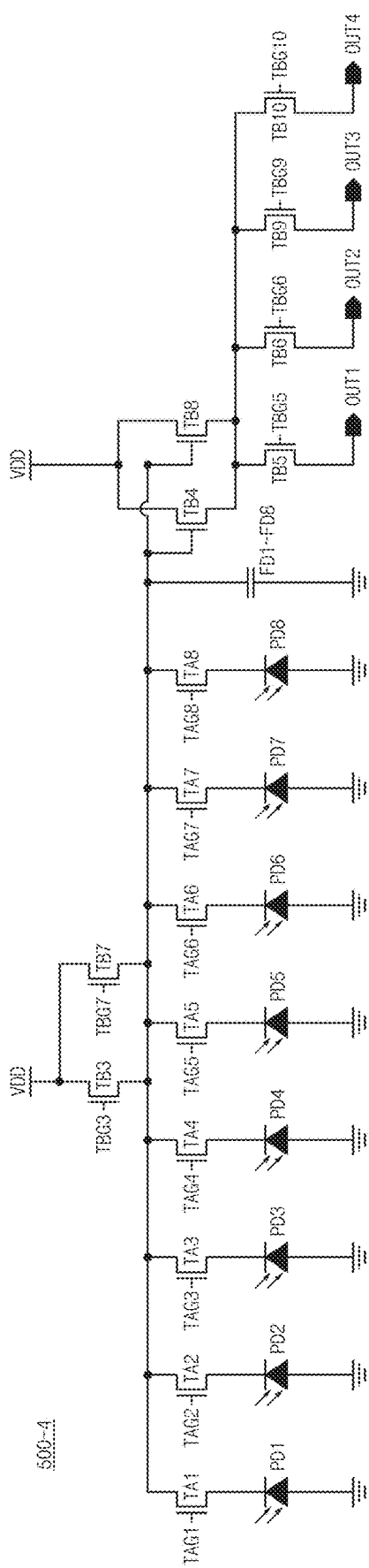
FIG. 9 is a schematic diagram illustrating still another example of an equivalent circuit diagram corresponding to a shared pixel shown in FIG. 5 based on the disclosed technology.

FIG. 9 is a schematic diagram illustrating still another example of an equivalent circuit diagram corresponding to a shared pixel shown in FIG. 5 according to the disclosed technology.

Referring to FIG. 9, the shared pixel 500-4 may include first to eighth photoelectric conversion elements PD1 to PD8, first to eighth horizontal transistors TA1 to TA8, first to eighth floating diffusion (FD) regions FD1 to FD8, and third to tenth vertical transistors TB3~TB10.

The first to eighth photoelectric conversion elements PD1 to PD8, the first to eighth horizontal transistors TA1 to TA8, and the first to eighth floating diffusion (FD) regions FD1 to FD8 contained in the shared pixel 500-4 shown in FIG. 9 may be identical in function and connection relationship to those of the shared pixel 500-3 shown in FIG. 8, and as such a detailed description thereof will herein be omitted for convenience of description and better understanding of the disclosed technology.

The fourth and eighth vertical transistors TB4 and TB8 may amplify a change in electrical potential of the first to eighth floating diffusion (FD) regions FD1~FD8 that respectively receive photocharges accumulated in the first to eighth photoelectric conversion elements PD1 to PD8, and may transmit the amplified potential to the fifth, sixth, ninth, and tenth vertical transistor TB5, TB6, TB9, and TB10. Gate regions, source regions, and drain regions of the fourth and eighth vertical transistors TB4 andTB8 may be electrically coupled to one another. Therefore, the fourth and eighth vertical transistors TB4 and TB8 may operate as a single source follower transistor.

In addition, as can be seen from the layout diagram of FIG. 5, the fifth and sixth vertical transistors TB5 and TB6 may be physically spaced apart from the ninth and tenth vertical transistors TB9 and TB10 by a predetermined distance. The fifth and sixth vertical transistors TB5 and TB6 may be coupled to the fourth vertical transistor TB4 acting as a source follower transistor. Here, the source follower transistor indicating the fourth vertical transistor TB4 may be physically located closer to the fifth and sixth vertical transistors TB5 and TB6. The ninth and tenth vertical transistors TB9 and TB10 may be coupled to the eighth vertical transistor TB8 acting as a source follower transistor. Here, the source follower transistor indicating the eighth vertical transistor TB8 may be physically located closer to the ninth and tenth vertical transistors TB9 and TB10. As a result, a signal transmission (Tx) speed can be greatly increased.

Each of the fifth, sixth, ninth, and tenth vertical transistors TB5, TB6, TB9, and TB10 may operate as a selection transistor. The fifth, sixth, ninth, and tenth vertical transistors TB5, TB6, TB9, and TB10 are not coupled in parallel to one another, and are turned on in different time sections in response to independent control signals TBG5, TBG6, TBG9, and TBG10, such that the fifth, sixth, ninth, and tenth vertical transistors TB5, TB6, TB9, and TB10 can independently output the output voltages OUT1~OUT4, respectively.

That is, as depicted in FIG. 9, in a situation in which the fifth, sixth, ninth, and tenth vertical transistors TB5, TB6, TB9, and TB10 are coupled to independent column lines in a manner that the fifth, sixth, ninth, and tenth vertical transistors TB5, TB6, TB9, and TB10 respectively output the output voltages OUT1~OUT4 in an alternate manner, the shared pixel may operate at a high speed without restricting the reset time of the column line.

The image sensor according to the embodiment of the disclosed technology may miniaturize each unit pixel by minimizing the number of transistors for each unit pixel.

In addition, in the case of a high-resolution pixel array, the number of unit pixels to be driven per frame may unavoidably increase. In this case, the operation speed of the shared pixel may be improved, such that the high-resolution pixel array can be driven while simultaneously being kept at a frame rate.

Although the image sensor according to the disclosed technology has been disclosed using the 4-shared pixel, the 8-shared pixel, and some circuits of the 4-shared pixel or the 8-shared pixel as an example, other implementations are also possible. For example, the shared pixel can include an arbitrary number of unit pixels and various circuits depending on the number of unit pixels can be constructed as needed.

It is understood that various embodiments and terminology used herein are not intended to limit technical ideas described in this document to specific embodiments, but rather to include various modifications, equivalents, and/or alternatives of the embodiments. Wherever possible, the same reference numbers will be used throughout the drawings to refer to the same or like portions.

As is apparent from the above description, the image sensor according to the embodiments of the disclosed technology can minimize the number of transistors contained in a single unit pixel, such that the unit pixel can be miniaturized in size.

In a high-resolution pixel array, the number of unit pixels to be driven per frame tends to increase. Based on implementations of the disclosed technology, the operation speed of the shared pixel can increase, which allows to maintain the frame rate and drive the high-resolution pixel array.

The embodiments of the disclosed technology may provide a variety of effects capable of being directly or indirectly recognized through the above-mentioned patent document.

Although a number of illustrative embodiments consistent with the disclosed technology have been described, it should be understood that numerous other modifications and embodiments can be devised by those skilled in the art. For example, numerous variations and modifications can be made in the component parts and/or arrangements. In addition to variations and modifications in the component parts and/or arrangements, alternative uses will also be apparent to those skilled in the art.

What is claimed is:

1. An image sensing device, comprising:
a first unit pixel group including a plurality of photoelectric conversion elements forming a first shared pixel and configured to generate photocharges in response to an incident light, the first unit pixel group further including first transistor elements and first floating diffusion regions configured to store the generated photocharges; and
a second unit pixel group located adjacent to the first unit pixel group and including a plurality of photoelectric conversion elements forming a second shared pixel and configured to generate photocharges in response to the incident light, the second unit pixel group further including second transistor elements and second floating diffusion regions configured to store the photocharges,
wherein the first shared pixel includes some of the first transistor elements and some of the second transistor elements.

2. The image sensing device according to claim 1, wherein:
each of the first shared pixel and the second shared pixel includes four photoelectric conversion elements, four floating diffusion regions, and eight transistor elements.

3. The image sensing device according to claim 1, wherein some of the first transistor elements are arranged adjacent to corresponding first floating diffusion regions in a horizontal direction and remaining first transistor elements are adjacent to the corresponding first floating diffusion regions in a vertical direction.

4. The image sensing device of claim 1, wherein some of the second transistor elements are arranged adjacent to corresponding second floating diffusion regions in a horizontal direction and remaining second transistor elements are adjacent to the corresponding second floating diffusion regions in a vertical direction.

5. The image sensing device according to claim 1, wherein the first floating diffusion regions are located around a center of the first unit pixel group and wherein the first floating diffusion (FD) regions are electrically coupled to one another.

6. The image sensing device according to claim 1, wherein the first shared pixel includes some of the first transistor elements that are arranged adjacent to corresponding first floating diffusion regions in a horizontal direction and configured to transfer the photocharges generated by the photoelectric conversion elements to the first floating diffusion (FD) regions.

7. The image sensing device according to claim 6, wherein the first shared pixel includes some other of the first transistor elements including a first transistor configured to reset the first to fourth floating diffusion (FD) regions and a second transistor configured to amplify a change in electrical potential of the first floating diffusion (FD) regions, the first transistor and the second transistor arranged adjacent to corresponding first floating diffusion regions in a vertical direction.

8. The image sensing device according to claim 7, wherein the first shared pixel includes some of the second transistor elements including a third transistor configured to output a signal corresponding to the change in electrical potential of the first floating diffusion (FD) regions and a fourth transistor coupled in parallel with the second vertical transistor and configured to amplify the change in electrical potential of the first floating diffusion (FD) regions, the third transistor and the fourth transistor arranged adjacent to corresponding second floating diffusion regions in a vertical direction.

9. The image sensing device according to claim 7, wherein the first shared pixel includes some of the second transistor elements including a third transistor and a fourth transistor that are arranged adjacent to corresponding second floating diffusion regions in a vertical direction and configured to output a signal corresponding to the change in electrical potential of the first floating diffusion (FD) regions.

10. The image sensing device according to claim 1, wherein:
each of the first shared pixel and the second shared pixel includes eight photoelectric conversion elements, eight floating diffusion regions, and sixteen transistor elements.

11. The image sensing device according to claim 1, wherein a photoelectric conversion element forming the first shared pixel, two first transistor elements, and a first floating diffusion region form a unit pixel and the first unit pixel group includes unit pixels that are separated from one another.

12. The image sensing device according to claim 1, wherein a photoelectric conversion element forming the second shared pixel, two second transistor elements, and a second floating diffusion region form a unit pixel and the second unit pixel group includes unit pixels that are separated from one another.

13. An image sensing device, comprising:
a pixel array including unit pixels, each unit pixel including a photoelectric conversion element configured to generate photocharges in response to an incident light, a floating diffusion region configured to store the generated photocharges, and transistors arranged around the floating diffusion region,
wherein the unit pixels are grouped into multiple unit pixel groups including a first unit pixel group and a second unit pixel group and a shared pixel is configured to include photoelectric conversion elements included in the first unit pixel group and transistor elements included in the second unit pixel group arranged adjacent to the first unit pixel group and to output a pixel signal corresponding to the generated photocharges.

14. The image sensing device of claim 13, wherein the shared pixel has a four-shared pixel structure that includes 4 photoelectric conversion elements, 4 floating diffusion regions, and 8 transistor elements.

15. The image sensing device of claim 13, wherein the shared pixel has an eight-shared pixel structure that includes 8 photoelectric conversion elements, 8 floating diffusion regions, and 16 transistor elements.

16. The image sensing device of claim 13, wherein the transistor elements included in the second unit pixel group includes two transistor elements that are coupled in parallel.

17. The image sensing device of claim 13, wherein the transistor elements included in the second unit pixel group includes two transistor elements that are coupled in series.

18. The image sensing device of claim 13, wherein the shared pixel further includes transistor elements included in the first unit pixel group and configured to transfer the generated photocharges to the floating diffusion region.

19. The image sensing device of claim 13, wherein the shared pixel further includes a transistor element included in the first unit pixel group and configured to reset an electric potential of the floating diffusion region in response to a control signal.

20. The image sensing device of claim 13, wherein the pixel array further includes additional shared pixel configured to include photoelectric conversion elements included in a first additional pixel group and transistor elements included in a second additional pixel group.

* * * * *